United States Patent
Guler et al.

(10) Patent No.: US 11,189,614 B2
(45) Date of Patent: Nov. 30, 2021

(54) PROCESS ETCH WITH REDUCED LOADING EFFECT

(71) Applicant: INTEL CORPORATION, Santa Clara, CA (US)

(72) Inventors: Leonard Guler, Hillsboro, OR (US); Elliot Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 15/923,885

(22) Filed: Mar. 16, 2018

(65) Prior Publication Data

US 2019/0287966 A1    Sep. 19, 2019

(51) Int. Cl.
  *H01L 27/088* (2006.01)
  *H01L 27/02* (2006.01)
  (Continued)

(52) U.S. Cl.
  CPC ...... *H01L 27/0886* (2013.01); *H01L 21/3081* (2013.01); *H01L 21/30604* (2013.01); *H01L 21/31111* (2013.01); *H01L 21/76224* (2013.01); *H01L 21/823431* (2013.01); *H01L 21/823481* (2013.01); *H01L 27/0207* (2013.01); *H01L 29/0649* (2013.01); *H01L 29/1037* (2013.01);
  (Continued)

(58) Field of Classification Search
  None
  See application file for complete search history.

(56) References Cited

U.S. PATENT DOCUMENTS 4,426,130 A    1/1984 Knop
8,431,466 B2 *  4/2013 Lin ............ H01L 29/7851
                                        438/443

(Continued)

FOREIGN PATENT DOCUMENTS

EP    1393365    1/2012

OTHER PUBLICATIONS

"Effects of Fin Width on Device Performance and Reliability of Double-Gate n-Type FinFETsss", Abstract, published in IEEE Transactions on Electron Devices, vol. 60, Issue 11, Nov. 2013, 1 page.

(Continued)

*Primary Examiner* — Vincent Wall
(74) *Attorney, Agent, or Firm* — Schwabe Williamson & Wyatt, P.C.

(57) ABSTRACT

A grating structure has a plurality of grating members that extend upward from a base in a spaced-apart parallel relationship and include an end member. For example, the grating structure is a plurality of semiconductor fins on a base. The base can be any structure underlying the grating members. The grating members have a member width and a member height. Adjacent grating members are spaced by a grating spacing. A process artifact is adjacent the end member and is spaced from the end member by a horizontal distance consistent with the member spacing. In some cases, the process artifact can be a stub of a second material on or otherwise extending from the base adjacent an end member of the grating structure. In other cases, the process artifact can be a recess in or otherwise extending into the base adjacent an end member of the grating structure.

15 Claims, 7 Drawing Sheets

(51) Int. Cl.
*H01L 29/10* (2006.01)
*H01L 29/06* (2006.01)
*H01L 21/8234* (2006.01)
*H01L 21/311* (2006.01)
*H01L 29/66* (2006.01)
*H01L 21/762* (2006.01)
*H01L 21/306* (2006.01)
*H01L 21/308* (2006.01)

(52) U.S. Cl.
CPC ...... *H01L 29/6653* (2013.01); *H01L 29/6681* (2013.01)

(56) References Cited

U.S. PATENT DOCUMENTS

| | | | |
|---|---|---|---|
| 8,617,996 B1* | 12/2013 | Chi | H01L 21/308 438/700 |
| 8,987,836 B2* | 3/2015 | Kim | H01L 29/785 257/401 |
| 9,418,994 B1* | 8/2016 | Chao | H01L 21/3081 |
| 9,799,570 B1* | 10/2017 | Cheng | H01L 21/823807 |
| 9,837,410 B1* | 12/2017 | Cheng | H01L 21/823885 |
| 10,014,297 B1* | 7/2018 | Sun | H01L 27/0886 |
| 10,109,531 B1* | 10/2018 | Hsu | H01L 21/76229 |
| 10,147,805 B2* | 12/2018 | Chen | H01L 29/7851 |
| 10,276,443 B2* | 4/2019 | Chen | H01L 21/31144 |
| 10,396,184 B2* | 8/2019 | Chang | H01L 21/823431 |
| 10,861,850 B2* | 12/2020 | Ho | H01L 29/6656 |
| 2013/0309838 A1* | 11/2013 | Wei | H01L 21/823821 438/424 |
| 2014/0227857 A1* | 8/2014 | Youn | H01L 21/823481 438/427 |
| 2015/0206759 A1* | 7/2015 | Tsao | H01L 29/0657 257/506 |
| 2015/0357439 A1* | 12/2015 | Liu | H01L 29/6681 257/401 |
| 2016/0056045 A1* | 2/2016 | Huang | H01L 21/31138 257/623 |
| 2017/0103985 A1* | 4/2017 | Kim | H01L 21/823821 |
| 2017/0170174 A1* | 6/2017 | Chang | H01L 29/66545 |
| 2017/0207096 A1* | 7/2017 | Wei | H01L 21/30604 |
| 2017/0338225 A1* | 11/2017 | Ching | H01L 21/76224 |
| 2018/0308746 A1* | 10/2018 | Hu | H01L 21/3086 |
| 2019/0148235 A1* | 5/2019 | Wang | H01L 29/6681 257/401 |
| 2020/0194313 A1* | 6/2020 | Liu | H01L 21/31053 |

OTHER PUBLICATIONS

Avtandil Tavkhelidze et al., "Observation of Geometry Induced Doping in Thin Si Nano-Grating Layers", ScienceDirect, Energy Procedia 92, 2016, pp. 896-903.

Anthony H.W.Choi, "Nanostructures in the III-Nitrides/Silicon Material System", Handbook of Optical Microcavities, 2015, pp. 246-249.

* cited by examiner

- start
- Deposit and pattern a hardmask on a material of the grating structure — 205
- Deposit spacer material between and adjacent the hardmask — 210
- Pattern the spacer material to expose the material between adjacent grating structures — 215
- Etch a trench in the base material where exposed between adjacent grating structures — 220
- Fill the trench with dummy material — 225

PROCESS ETCH WITH REDUCED LOADING EFFECT

BACKGROUND

Many different etch processes may be used in the course of fabricating an integrated circuit. For example, material layers can be etched to define device structures, to reduce the thickness of a desired region, or to define openings or trenches. A particular etch process may be selected based on its selectivity to the material to be removed, the directionality of the etch process, and the desired etch rate of various materials in the structure. Due to the variety of materials and number of process variables involved, many non-trivial challenges exist with etch processes for integrated circuits.

The figures depict various embodiments of the present disclosure for purposes of illustration only. Numerous variations, configurations, and other embodiments will be apparent from the following detailed discussion.

DETAILED DESCRIPTION

An integrated circuit with one or more grating structures is disclosed. The present disclosure is also directed to methodologies for fabricating integrated circuits that include one or more grating structure. In some embodiments, the grating structure can be or otherwise include a series of semiconductor fins, gate structures, or sensor gratings, to name a few examples. In one example methodology, the use of a dummy structure during etch processing can provide a grating structure of improved geometric consistency. For example, semiconductor fins fabricated according to methodologies of the present disclosure may exhibit a reduced variation in fin width, either within a single fin (where width of fin is consistent from top to bottom of fin or for at least a portion of the fin) or a group of fins (where width of each fin in the group as measured at a certain fin height is consistent), or both. The improved consistency in a critical dimension among a plurality of grating structure members and/or within a single grating structure member can provide corresponding improvements in device performance. Numerous configurations will be apparent.

General Overview

In the manufacture of integrated circuits, one or more grating structures may be formed on a base or substrate. A grating structure can be any regularly spaced collection of generally identical, parallel elements. The elements of a grating structure define an element height, an element width or thickness, an element spacing, and a grating pitch. In one example, a grating structure includes a plurality of spaced-apart semiconductor fins. The semiconductor fins may be part of fin-based transistor structures, such as CMOS devices. Formation of grating structures typically involves etch processing to define the grating structure. Etch processing may include one or more of chemical wet or dry etch, reactive ion etch (RIE), deep reactive ion etch (DRIE), fast atom beam etch (FAB), and plasma etch (PE) to name a few examples. Various etch parameters may be adjusted or tuned to provide the desired etch performance. Despite the ability to tune the etch process to some extent, it remains difficult to achieve consistent etch performance, and therefore consistent structure geometry, within one grating structure and even more difficult among a plurality grating structures in an integrated circuit. For example, in a structure that includes a plurality of consistently spaced semiconductor fins, the end members of the plurality may exhibit a more sloped cross-sectional profile along the outer face of the fin. In contrast, a fin between two other fins may have a more consistent cross-sectional profile. This more sloped profile of the end fins provides an increased fin width at middle and lower regions of the fin compared to the upper regions of the fin. Without being constrained to any particular theory, it is believed that the difference in etch performance is due to the difference in the quantity of material being etched adjacent the end members compared to the quantity of material being etched between adjacent fins. This difference in etch performance based on the quantity of material being etched is referred to as the etch loading effect. The etch loading effect results in different fin geometry for end members and middle members of a grating structure. Variations in fin geometry for semiconductor structures generally results in inconsistent or degraded device performance, particularly when device structures have a critical dimension of about 10 nm or less. For example, in a FinFET device, the final fin width generally defines the effective gate length in the transistor. Inconsistency in the fin width of even a few nanometers can result in variations in the operating voltage, device current, short-channel effects, leakage, and overall performance and reliability. Accordingly, consistency in the geometry of semiconductor device structure becomes more important as the device size becomes smaller. Thus, a need exists for integrated circuit structures with more consistent geometries within and among grating structure members.

Thus, methodologies of the present disclosure can be used to reduce or eliminate the etch loading effect by reducing or eliminating the variation in the quantity of material being etched for members of a grating structure. In accordance with some embodiments of the present disclosure, a method of fabricating a grating structure includes forming fins for use in a transistor structure. In one such embodiment, a hardmask is formed on a base, which may include one or more layers of semiconductor material. The hardmask is patterned to define spaced-apart fins that will be formed by etching into the base, for example. A spacer material is disposed on the base between adjacent regions of the hardmask and adjacent to an end member of the hardmask corresponding to an end member of the grating structure. For example, the end region of spacer material has a width consistent with the regions of hardmask defining the fins. The spacer material is compositionally different from the hardmask and from the base material(s), for example. A trench is defined in the base and is spaced from an end fin of the to-be-formed fins by 50% to 200% of the fin spacing. The trench is filled with dummy material. After removing the spacer material, the base is etched to define the fins. Due to the presence of the dummy structure, the amount of material to be removed is the same or approximately the same for all members of the grating structure (e.g., such that the amounts of material to be removed are within a certain threshold of a target amount, such as within 20% or 15% or 10% or 5% or 2% or 1% of that amount). After forming the fins, the dummy material can be recessed or removed. In such a fabrication method, the amount of material to be etched between adjacent fins is equal to or closely matches the amount of material to be etched adjacent the end fin. In other words, the dummy material simulates the presence of another fin adjacent the end fin, resulting in sufficiently similar or identical etch performance for all of the fins, even the end fins.

The resulting grating structure (e.g., a series of fins) exhibits improved consistency in member width, in accordance with an embodiment of the present disclosure. For example, fins with a width of 5-8 nm or less may exhibit a variation in fin width of less than 3 nm, of less than 2 nm, or less than 1 nm along the upper portion (e.g., the top 50 nm) of the fin. The use of the dummy material during the etch process results in a process artifact in some embodiments, such as a stub of dummy material or a recess in the base adjacent the end member of the grating structure.

In accordance with another aspect of the present disclosure, a grating structure has a plurality of grating members that include an end member. For example, the grating structure is a plurality of semiconductor fins on or above a base. The grating members (e.g., fins) extend upward and are arranged in a spaced-apart parallel relationship. The grating members each have a member width and a member height. Adjacent grating members are spaced by a grating spacing. A process artifact is on the base adjacent the end member(s). The process artifact is spaced from the end member by a horizontal distance from 50% to 200% of the member spacing. The process artifact can be a stub of a second material on the base adjacent an end member of the grating structure, where the second material is compositionally different from the material of the grating members. The stub may define one or more peaks corresponding to a boundary between regions of different process etch rates. The process artifact can also be a recess in the base adjacent an end member of the grating structure, where the stub is completely removed along with additional base material to form said recess. In any such embodiments, the process artifact can be spaced from the end fin by an amount equal to or close to the grating/fin spacing. Numerous configurations and variations will be apparent in light of this disclosure.

Various material layers of the present disclosure may be described as being compositionally different. Materials that are different or compositionally different as used herein refers to two materials that have different chemical compositions. This compositional difference may be, for instance, by virtue of an element that is in one material but not the other (e.g., silicon germanium or SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., boron, gallium and magnesium) or the same dopants but at differing concentrations.

As discussed herein, terms referencing direction, such as upward, downward, vertical, horizontal, left, right, front, back, etc., are used for convenience to describe embodiments of integrated circuits having a base or substrate extending in a horizontal plane. Embodiments of the present disclosure are not intended to be limited by these directional references and it is contemplated that integrated circuits and device structures in accordance with the present disclosure could be used in any orientation.

The use of "group III-V semiconductor material" (or "group III-V material" or generally, "group III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. Group III may also be known as the boron group or IUPAC group 13, group IV may also be known as the carbon group or IUPAC group 14, and group V may also be known as the nitrogen family or IUPAC group 15, for example.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate, for example, an integrated circuit with a grating structure and a process artifact adjacent the end member of the grating structure. For example, a stub of dummy material is spaced from an end member of the grating structure by a distance consistent with the spacing between members in the grating structure. In another example, such tools may also indicate a recess or dimple in the base material, where said recess is spaced from an end member of the grating structure by a distance consistent with the spacing between members in the grating structure. In a further example, such tools may also indicate a fin-like structure between groups of semiconductor fins, where the fin-like structure is dummy structure of the same material as the fins, but that is not electrically connected to other device structures, such as a gate structure and/or source and drain structures and/or interconnect features. In one example, TEM can be useful to show a cross section of part of an integrated circuit. In another example, x-ray crystallography can be useful to illustrate the crystal quality of the fin material and process artifacts. In some embodiments, the techniques described herein may be detected based on the benefits derived from their use, which includes semiconductor devices with improved performance based on geometric consistency. For example, semiconductor fins may have a variation in horizontal fin width that is less than 1-3 nm in the top portion (e.g., top 50 nm) of the fins. Numerous configurations and variations will be apparent in light of this disclosure.

Architecture and Methodology

FIGS. 1-4 illustrate cross-sectional views of example portions of integrated circuit 10 having one or more grating structures 100. As can be seen, the cross-section is taken perpendicular to the grating structures, and in FIG. 4 the cross-section is further taken through that gate region. The relative dimensions and shape of features shown in the figures may differ in some ways for ease of illustration. Some features may be omitted or drawn with different geometry for convenience of illustration, however, the present disclosure is not limited by these differences.

Figure 1:
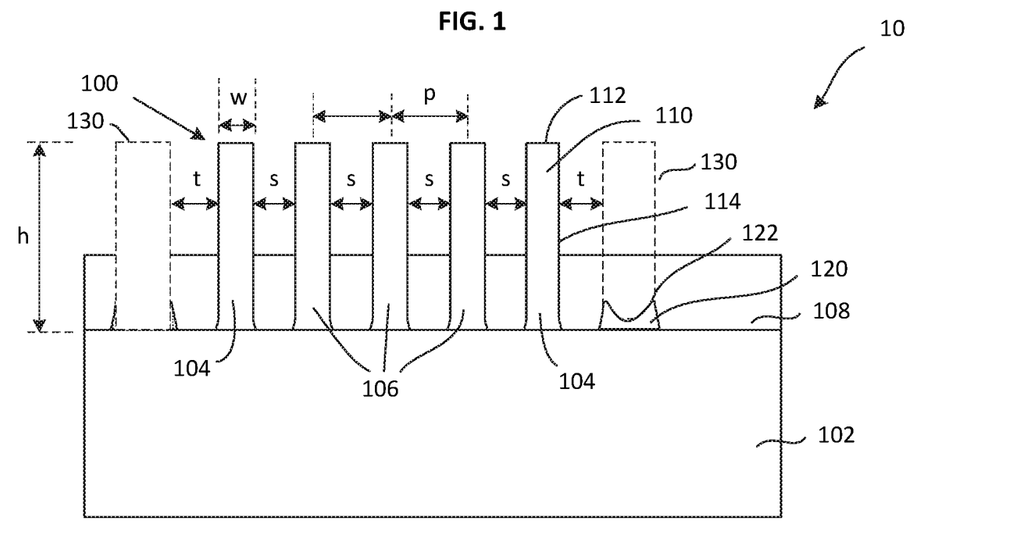
FIG. 1 is a cross-sectional illustration of part of an integrated circuit showing a plurality of grating structures and at least one stub of dummy material on a base, in accordance with an embodiment of the present disclosure.

FIG. 1 illustrates part of an integrated circuit 10 that includes a grating structure 100 formed on a base 102, in accordance with some embodiments of the present disclosure. The base 102 may be the same or different material as the grating structure 100. A layer of isolation material 108 is formed on the base 102 in contact with lower portions of the grating structure.

In the embodiment of FIG. 1, the grating structure 100 includes a plurality of fins 110 comprising semiconductor material. Each fin 110 extends vertically upward from the base 102 with a generally consistent fin height h and a fin width w. Fins 110 generally have the same geometry and fin spacing s between adjacent fins 110. The grating structure 100 defines a pitch p corresponding to the horizontal distance between corresponding locations on adjacent members (e.g., fins 110) of the grating structure 100. In some embodiments, the grating structure 100 has two or more members. As illustrated, the grating structure 100 includes two end members 104 (e.g., end fins) and three middle members 106 between the end members 104. Each end member 104 is adjacent only one other member (e.g., fin 110) of the grating structure 100. Each middle member 106 is between two adjacent members (e.g., fins 110). The end members 104 are spaced from other structures by at least twice the fin spacing s, including at least three times, at least five times, at least ten times, and other multiples of the fin spacing s. Although five fins 110 are illustrated in FIG. 1, the grating structure 110 can have as few as two fins and may have more than five fins 110, such as tens, hundreds, thousands, or more.

In some embodiments, fins 110 have a fin height h from up to 50 to 200 nm above the base 102 and a fin width w of less than 20 nm, including 10 nm or less, 8 nm or less, 7 nm or less, 6 nm or less, 5 nm or less, 4 nm or less, and 3 nm or less. Fin width w can be measured at or near a top end 112 of a fin 110 and at other locations below the top end 112 such as at mid-point of the fins 110 (e.g., between the 20% and 80% height points of the fin). Note that in some cases where the top end 112 of fins 110 is rounded (due to the nature of the fin forming process used), the width w of the fin can be measured a distance from the top 112 so as to not be affected by or otherwise implicate the variation attributed to that rounded top 112. In some embodiments, the fin width w is measured at or near the top end 112 (e.g., within 10 nm of top end 112, but not in the rounded portion of the top, if present) and/or at a location 114 that is about 20 nm to 50 nm or some other vertical distance below the top end 112. Likewise, the fin width w can be measured at or near the location on the fin corresponding to the 20% fin height level (as measured from the bottom of fin) and/or the location on the fin corresponding to the 80% fin height level (as measured from the bottom of fin). In a more general sense, the width can be measured anywhere along the fin height that avoids the variation (if any) at the top of the fin and the variation (if any) at the bottom of the fin. To this end, the top 1 nm to 5 nm of the fin and the bottom 1 to 5 nm of the fin can be avoided with respect to the location(s) where fin width w is measured, according to some embodiments. In some embodiments, the fin width w differs by less than 3 nm as measured at or near the top end 112 and at the location 114 that is 50 nm below the top end 112. In some embodiments, the difference is 2 nm or less or 1 nm or less. Stated differently, the fin width along the top 50 nm (or other distance) of each fin 110 varies by less than 3 nm, such as less than 2 nm or less than 1 nm. Stated in yet another way, each fin 110 has an average fin width w along the top 50 nm or so (or other chosen distance) of the fin height h. The average fin width w has an error of less than ±1.5 nm, including an error of ±1.0 nm or less, and ±0.5 nm or less, in some such embodiments. In other cases, the fin width can be measured at one or more locations along the height of the fin, the one or more locations being free of tapering, rounding, or flare that might be associated with the topmost (e.g., top 1-5 nm of fin) and bottommost fin portions (e.g., bottom 1-5 nm of fin).

The grating structure 100 includes a process artifact 120 on the base 102 adjacent the bottom end of the end members 104 of the grating structure 100. The process artifact 120 results, for example, from the use of a dummy structure 130 adjacent the end member 104 during the etch process when the grating structure 100 is defined. In FIG. 1, example dummy structures 130 are illustrated in broken lines. In some embodiments, the process artifact 120 is a stub of material different from the material of the grating structure 100 and base 102. For example, the grating structure 100 includes semiconductor fins 110 of silicon, silicon germanium, gallium arsenide, or some other semiconductor material. The process artifact 120 may be an oxide, amorphous carbon, a metal, or some other material compositionally different from the semiconductor material.

Due to the difference in etch rates for the material of the grating structure 100 and surrounding materials, the process artifact 120 may exhibit a peak 122 corresponding to the boundary between materials of different etch rate. In some embodiments, the process artifact 120 exhibits two peaks 122, one for each edge of the dummy structure 130, as can be seen in FIG. 1. The etch rate may be affected by one or more process parameters, including the composition of the material being etched and the quantity of material. In some embodiments, the process artifact 120 is spaced from the end member 104 by a horizontal distance t that is from one-half to twice the value of the fin spacing s. The spacing (horizontal distance t) to the process artifact 120 may be measured, for example, by the horizontal distance from the fin sidewall to the edge of the stub of dummy material. In other embodiments, the distance may be measured to the nearest peak in the stub of dummy material. For example, the process artifact 120 is spaced by a value of t that is 50% to 200% of the fin spacing s, including 60%, 70%, 80%, 90%, 100%, 110%, 120%, 130%, 150%, 170%, 180%, and 190%.

Figure 2:
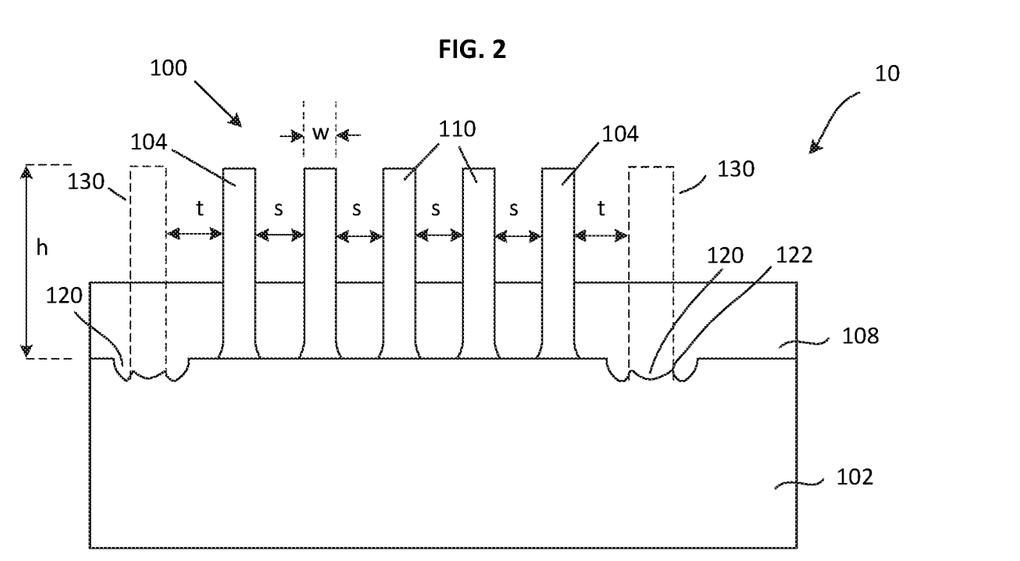
FIG. 2 is a cross-sectional illustration of part of an integrated circuit showing a plurality of grating structures and a recess in the base adjacent end members of the grating structures, in accordance with an embodiment of the present disclosure.

Referring now to FIG. 2, a cross-sectional view shows an example of part of an integrated circuit 10 that includes a grating structure 100 on the base 102 and with a layer of isolation material 108 in contact with a lower portion of the grating structure 100, in accordance with an embodiment of the present disclosure. As with the embodiment of FIG. 1, the grating structure 100 of this embodiment includes a plurality of semiconductor fins 110 spaced by a fin spacing s and having a fin height h and a fin width w. Here, the process artifact 120 is a recess in the base 102, where the recess 120 is spaced from each end member 104 by horizontal distance t that is no more than twice the fin spacing s. In some embodiments, the recess 120 defines one or more peaks 122 corresponding to boundaries between regions of material having different etch rates. The process artifact 120 results from a dummy structure 130 (shown in broken lines) that was removed after defining the fins 110. Since it is difficult to perform an etch to remove the dummy structure 130 to the exact level as the base 102, the etch process very likely will either remove more or less material than present in the dummy structure 130. When the etch removes material additional to that of the dummy structure 130, the process artifact 120 is a recess. In contrast, when the etch removes less than all of the dummy material, the process artifact 120 is a stub of dummy material as shown, for example, in FIG. 1.

Figure 3:
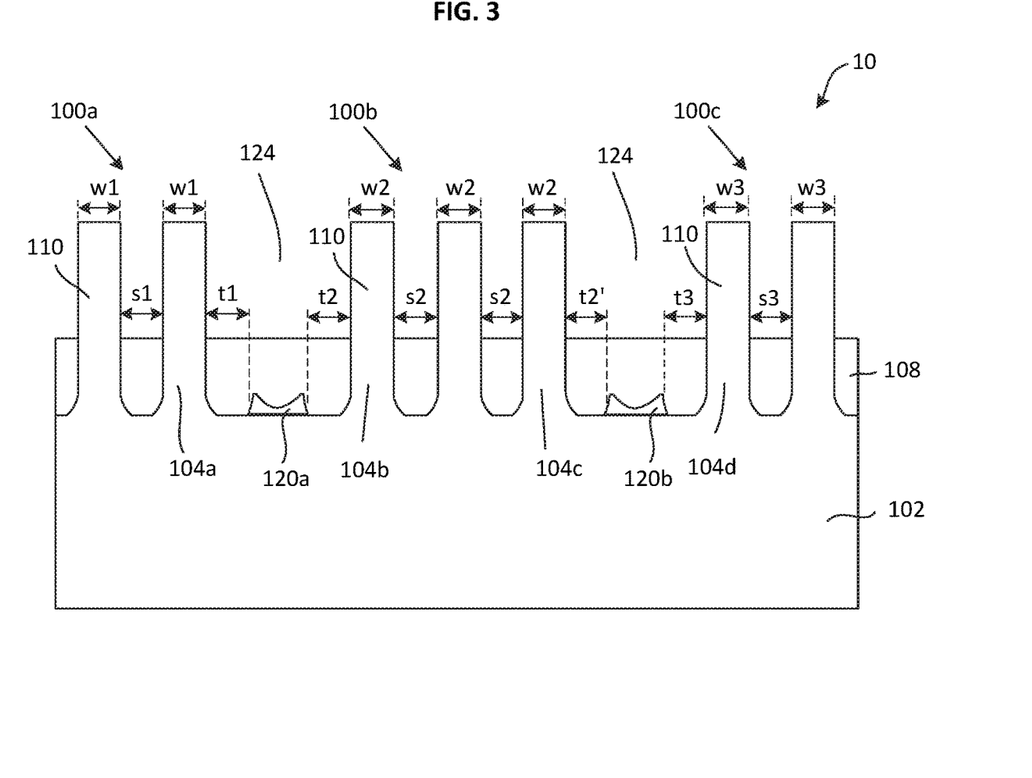
FIG. 3 is a cross-sectional illustration of part of an integrated circuit showing a plurality of grating structures, where at stub of dummy material is on the base between adjacent grating structures, in accordance with an embodiment of the present disclosure.

Referring now to FIG. 3, a cross-sectional view illustrates an example of another integrated circuit 10 with three grating structures 110a, 110b, 110c each including a plurality of fins 110 on a base 102, in accordance with an embodiment of the present disclosure. Fins 110 of the first grating structure 100a have a first fin width w1 and first fin spacing s1; fins 110 of the second grating structure 100b have a second fin width w2 and a second fin spacing s2; fins 110 of the third grating structure 100c have a third fin width w3 and third fin spacing s3. Fin widths w1, w2, w3 may be the same or different and fin spacings s1, s2, s3 may also be the same or different.

A first process artifact 120a is in the gap 124 between the first and second grating structures 100a, 100b. The first process artifact 120a is spaced by distance t1 from end member 104a of the first grating structure 100a and spaced by distance t2 from an end member 104b of the second grating structure 100b. A second process artifact 120b is in the gap 124 between the second and third grating structures 100b, 100c. The second process artifact 120b is spaced by distance t2' from end member 104c of the second grating structure 100b and spaced by distance t3 from end member 104d of the third grating structure 100c. The value of distances t2 and t2' may be the same or different. Although illustrated as having a width similar to the fin width w, it is contemplated that each process artifact 120 may be larger, even much larger, than fin width w of the relevant grating structure(s). In some embodiments, the values of t1, t2, t2', and t3 are equal or substantially equal (±5%) regardless of the value of the respective fin spacings s1, s2, s3.

Figure 4:
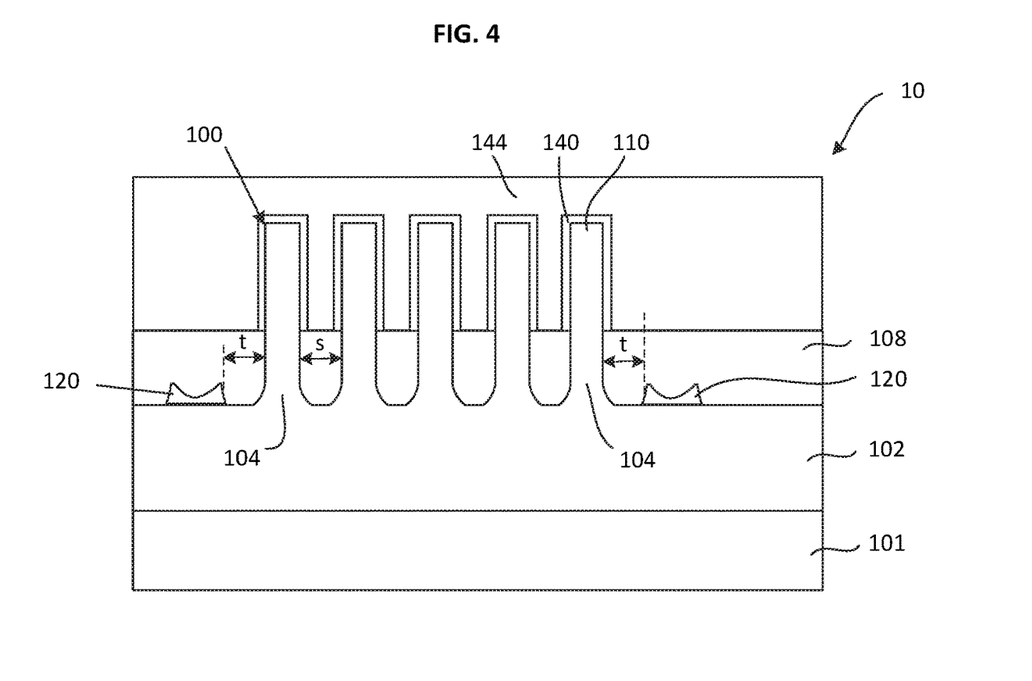
FIG. 4 is a cross sectional illustration showing the example structure of FIG. 1 after formation of a gate structure over fins of the grating structure, in accordance with an embodiment of the present disclosure.

Referring now to FIG. 4, a cross-sectional view illustrates an example of part of an integrated circuit 10 with a grating structure 110 that includes a plurality of fins 110 on a base 102, in accordance with an embodiment of the present disclosure. In this embodiment, the fins 110 extend upward from the base 102 and comprise the same material as the base 102. In some such embodiments, the structure may result from defining the fins 110 in bulk silicon or other base of semiconductor material using etch processes of the present disclosure. In other embodiments, the fins 110 comprise the same material as the base 102 except for dopants in the semiconductor material of the fins 110. In yet other embodiments, the base 102 is a layer of semiconductor material on a substrate 101, where the base 102 is used to define fins 110. For example, the base 102 is a layer of germanium or silicon germanium on a substrate 101 of silicon, according to some such embodiments.

A layer of isolation material 108 is formed on the base 102 in contact with lower portions of the fins 110. For example, the top 50 to 70 nm of each fin 110 extends above the layer of isolation material 108 and can be used to complete transistor structures, as will be appreciated. A process artifact 120 is present on the base 120 adjacent each end member 104 of the grating structure 110. To minimize the etch loading effect, the process artifact 120 is left over from a dummy structure spaced from the end member 104 by distance t, which may be from one half to two times the fin spacing s. In some embodiments, each process artifact 120 may be spaced from the end member 104 by different distances, each of which is no more than twice the fin spacing s and no less than half of fin spacing s. A gate dielectric 140 contacts each of the fins 110 and a gate electrode 144 contacts the gate dielectric 140.

The gate dielectric 140 may be, for example, any suitable gate dielectric material such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 140 to improve its quality when a high-k material is used. Further, the gate electrode 144 may comprise a wide range of suitable metals or metal alloys, such as aluminum, tungsten, titanium, tantalum, copper, titanium nitride, or tantalum nitride, for example. In some embodiments, the gate dielectric 140 and/or gate electrode 144 may include a multilayer structure of two or more material layers or components. For instance, in one such embodiment, the gate dielectric 140 is a bi-layer structure having a first dielectric material (e.g., silicon dioxide) in contact with the channel region and a second dielectric material (e.g., hafnium oxide) in contact with the first dielectric material, the first dielectric material having a dielectric constant that is lower than the dielectric constant of the second dielectric material. Likewise, the gate electrode structure 144 may include a central metal plug portion (e.g., tungsten) with one or more outer work function layers and/or barrier layers (e.g., tantalum, tantalum nitride), and/or a resistance reducing cap layer (e.g., copper, gold). In some embodiments, the gate dielectric 141 and/or gate electrode 144 may include grading (increasing or decreasing, as the case may be) of the concentration of one or more materials therein. Other gate structure features not visible in the particular cross-section shown in FIG. 4 may also be included, such as gate spacers of silicon dioxide or silicon nitride or other suitable gate spacer material. Numerous different gate structure configurations can be used, as will be apparent in light of this disclosure.

Figure 5:
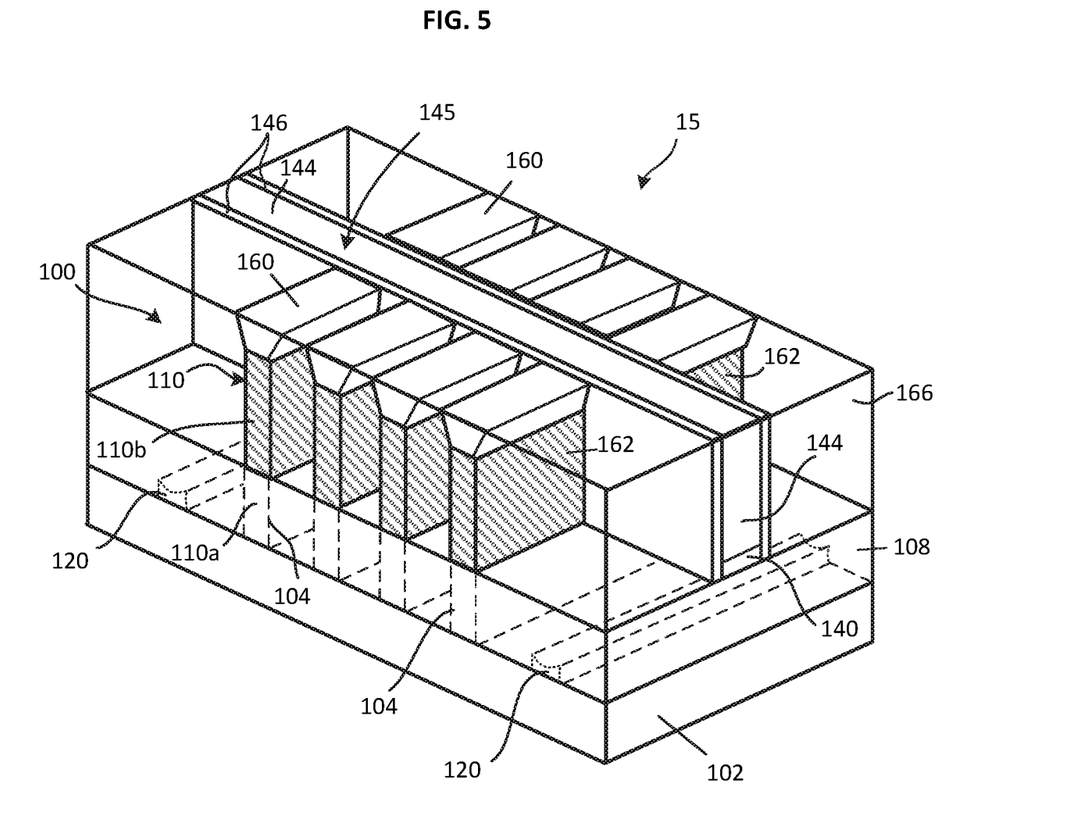
FIG. 5 is a perspective view of an example integrated circuit structure implementing a grating structure of fins, in accordance with an embodiment of the present disclosure.

Referring now to FIG. 5, a perspective view illustrates an example integrated circuit structure 15 that implements a grating structure 100 of fins 110 in accordance with an embodiment of the present disclosure. As will be appreciated, this particular integrated circuit includes a number of transistor devices, as will now be explained in further detail. Fins 110 extend upward from the base 102 and are arranged in a spaced-apart relationship. In this example structure, each fin 110 includes a bottom fin portion 110a of a first semiconductor material (e.g., silicon) and an upper fin portion 110b of a second semiconductor material compositionally different from the first semiconductor material (e.g., Ge or SiGe). In one embodiment, the upper fin portion 110b may be formed using a replacement material approach in which the upper part of fin 110 is removed and replaced with a replacement material, as will be appreciated. The replacement material can be provided, for instance, in the context of an aspect ratio trapping methodology, where placeholder fins native to a given substrate are first formed using the techniques provided herein, and then removed to provide a recess in which the replacement material is deposited. The recess effectively has the same geometric consistency as the placeholder fin, so the resulting fin portion 110b formed using such a replacement material approach also has that same geometric consistency. In another embodiment, the different materials of the upper fin portion 110b and the bottom fin portion 110a result from layers of semiconductor material that define the base 102 when the fins 110 are formed using an etch process, as variously provided herein. A layer of isolation material 108 on the base extends part way up each fin 110. In one embodiment as shown in FIG. 5, the layer of isolation material 108 extends up at least to the top of the semiconductor material of the bottom fin portion 110a. The layer of isolation material 108 is formed over process artifacts 120, which are spaced from each end member 104 of the grating structure 100.

Each fin 110 has or is otherwise associated with source and drain regions 162. The source and drain regions 162 may be part of the fin itself in some embodiments, while in other embodiments may be epitaxially provided into recesses formed on the fin to either side of the corresponding gate structure 145. Respective source and drain contacts 160 are in turn formed on the source and drain regions 162. The source and drain contacts 160 can be formed in contact trenches etched into additional isolation material 166 that is provisioned over isolation material 108 to planarize the structure 15. A gate structure 145 contacts the channel region (not visible) of each fin 110 between respective source and drain regions 162. As can be seen, the gate structure 145 includes a gate electrode 144 over the channel region, a gate dielectric 140 between the channel region and the gate electrode 144, and gate spacers 146 that isolate the gate electrode 144 from source and drain contacts 160. The gate structure 145 may be configured as a trigate, gate all around, or other gate configuration (e.g., double gate), as will be appreciated. A further layer of isolation material 166 is on the isolation material 108 and extends vertically to the top surface of the source and drain contacts 160 and gate structure 145.

Figure 6:
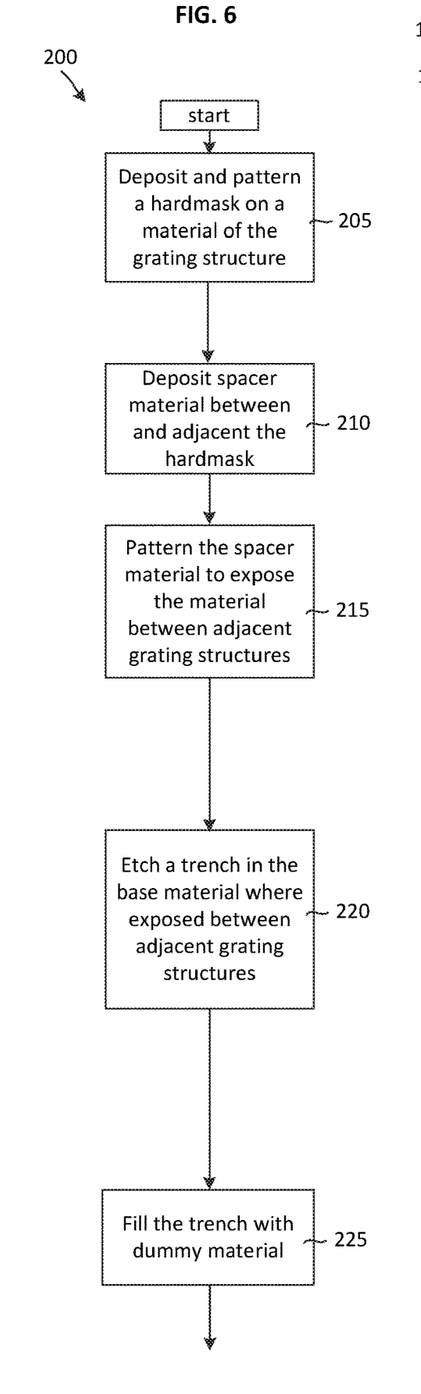
FIG. 6 is a flowchart illustrating a method of fabricating an integrated circuit, in accordance with an embodiment of the present disclosure.

Referring now to FIG. 6, a flow chart illustrates processes in an example method 200 of fabricating a grating structure, in accordance with some embodiments of the present disclosure. To facilitate understanding of processes in method 200, FIGS. 7A-7H are presented alongside process blocks of method 200 and illustrate example structures. Method 200 is described for an integrated circuit having two adjacent grating structures; however, processes of method 200 can be applied in similar fashion to define a single grating structure or more than two grating structures, as will be appreciated.

In one embodiment, method 200 begins with depositing and patterning 205 a hardmask on a base of material to be used to define the grating structure. The hardmask can be titanium nitride (TiN), a metal, or other suitable mask material, as will be appreciated. The hardmask is patterned to define the grating structure by etch processing. In one embodiment, the hardmask is patterned to include a series of lines that result in a spaced-apart arrangement of fins after etching the base material between the lines of hardmask. The hardmask may be patterned to provide a grating structure of fins as discussed above with reference to FIGS. 1-4, for example. In other embodiments, the hardmask is patterned to define gate structures, sensor gratings, or other grating structure.

In some embodiments, the base can include one or more layers of semiconductor materials, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples. The semiconductor material(s) can be selected in some embodiments from group III-V materials and/or group IV materials. In some embodiments, the base material is continuous with or is part a substrate, such as a monolithic structure of bulk semiconductor material or a substrate providing structural support. In some such embodiments, the base material adjacent the top surface may be the same material as the substrate except for the presence of dopants in portions of the base from which the grating structure will be defined. In other embodiments, the base can comprise a semiconductor layer deposited or grown on, or transferred to, a structural substrate. An example is a silicon carbide layer epitaxially grown on a sapphire substrate. The base in some embodiments can include a semiconductor on insulator (SOI) structure where an insulator or dielectric material (e.g., an oxide material, such as silicon dioxide) is sandwiched between two semiconductor layers, such as in a buried oxide (BOX) structure. For example, in some such embodiments the SOI structure includes a silicon dioxide layer on a bulk silicon wafer, and a layer of monocrystalline silicon on top of the silicon dioxide layer. As will be appreciated, the thickness of the semiconductor material(s) of the base (or the semiconductor layer(s) of the substrate, as the case may be) can be any thickness suitable for the devices to be fabricated thereon.

Figure 7A:
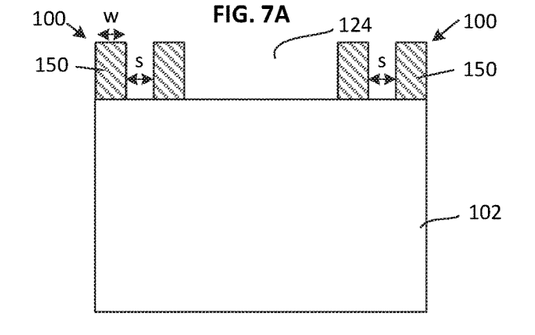
FIGS. 7A-7H illustrate cross-sectional views of example structures resulting from the method of FIG. 6.

FIG. 7A illustrates a cross-sectional view of a base 102 of semiconductor material with a hardmask 150 formed and patterned on the top surface. The hardmask 150 is configured to result in at least one group of spaced-apart fins spaced by fin spacing s. In some embodiments, hardmask 150 is configured to define two or more grating structures (e.g., groups of fins 110), where each grating structure is separated by a gap 124 that is greater (e.g., much greater) than the spacing s (e.g., fin spacing s) between adjacent members of the grating structures 100. In one embodiment, the size of hardmask regions defines the intended fin width w.

Method 200 continues with depositing 210 spacer material between and/or adjacent to regions of the hardmask. In some embodiments, the spacer material is an oxide (e.g., $SiO_2$), a nitride (e.g., SiN), or a dielectric material. The spacer material can be selected, for example, to be removed from the base by wet or dry processing without removing the hardmask. In some embodiments, the spacer material is patterned to fill open areas between regions of the hardmask and to define spacers contacting portions of the hardmask corresponding to end members of the grating structure. For example, the spacer material occupies openings between hardmask material defining fins in addition to defining an end spacer with a width t, which may equal the fin spacing s, where the end spacer is adjacent the hardmask corresponding to each end member of the grating structure. In some embodiments, the spacer material is deposited as a blanket layer over the hard mask, followed by planarization to expose the top surface of the hardmask. Etch processing can then be performed to expose the base between the grating structures where a trench will be formed in subsequent processes.

Figure 7B:
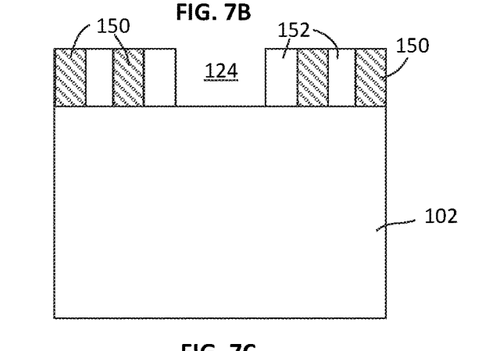

FIG. 7B illustrates an example of hardmask 150 and spacer material 152 on the top surface of the base 102. The base 102 is exposed in the gap 124 between spacer material 152 flanking the hardmask 150 regions that correspond to end members of the grating structure.

Method 200 continues with defining 220 a trench in the base material adjacent to each grating structure. In some embodiments, the trench will be adjacent a single grating structure. In this example, the trench is formed between two grating structures. The trench can be defined using an anisotropic etch or other suitable process to provide substantially vertical trench sidewalls (e.g., ±5°). The trench is spaced from the grating structure as determined by the spacer material 152 flanking the hardmask 150. In some embodiments, the trench is defined with a trench depth at least as great as the intended fin height h. For example, the trench extends into the base material to a depth of 30-500 nm.

Figure 7C:
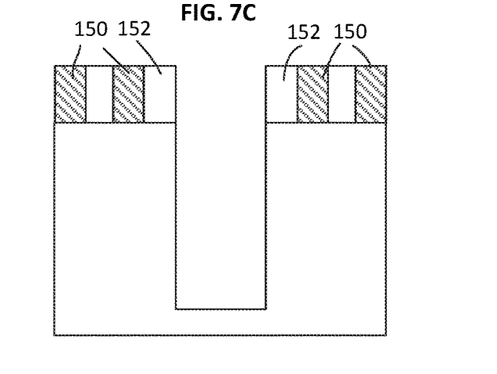

FIG. 7C illustrates an example structure with a trench 154 defined in the base material between spacer material 152 adjacent each hardmask 150 region. Spacer material 152 adjacent the gap 124 has a horizontal thickness of distance t. In some embodiments, the horizontal thickness of the spacer material 152 is equal to fin spacing s. In other embodiments, the horizontal thickness (distance t) of the spacer material 152 adjacent the gap 124 is at least half of the fin spacing s. Stated another way, distance t is from one half to two times the fin spacing s.

Method 200 continues with filling 225 the trench with dummy material. The dummy material can be deposited using any suitable process, including atomic layer deposition (ALD), chemical vapor deposition (CVD), physical vapor deposition (PVD), epitaxial growth, or combinations of these processes, to name a few examples. In some embodiments, the structure can be planarized as needed so that the top surface of the dummy material is coplanar with the hardmask material. In one embodiment, the dummy material is selected with etch selectivity so that the dummy material is not affected or is minimally affected during subsequent removal of the spacer material. Examples of suitable dummy material include metals, amorphous carbon, oxides (e.g., $SiO_2$), nitrides (e.g., $Si_3N_4$), a high-k dielectric (e.g., hafnium oxide), a low-k dielectric (e.g., porous $SiO_2$), alumina, or other materials etchable by a wet and/or dry etch process.

Figure 7D:
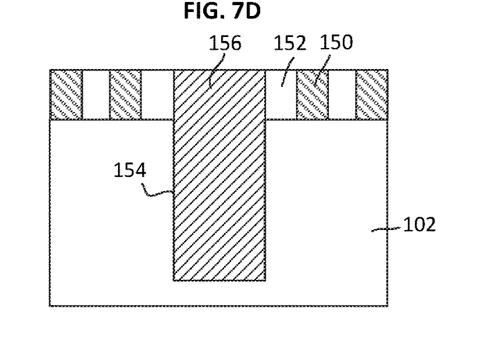

FIG. 7D illustrates an example structure with dummy material 156 in the trench 154 that was defined in previous processing. The top surface of the dummy material 156 is generally coplanar with the top surfaces of the hardmask 150 and spacer material 152. The dummy structure may include one or more layers of the same or different dummy material 156. Also, although a single structure of dummy material 156 is shown, a structure of dummy material 156 may similarly be formed adjacent the end member of each grating structure. For example, instead of a single structure of dummy material 156 between adjacent grating structures, two structures of dummy material 156—one adjacent each grating structure 100—can be used. Numerous variations and embodiments will be apparent in light of the present disclosure.

Method 200 continues with removal 230 of the spacer material to expose regions of the base to be etched for defining the grating structure (e.g., fins). The spacer material can be removed 230 by any suitable wet or dry etch process. For example, when the spacer material is $SiO_2$, hydrofluoric acid may be used to remove the spacer material. Other suitable processes will be apparent in light of the present disclosure. Optionally, the dummy material can be recessed to be coplanar with the base 102 after removal of the spacer material.

Figure 7E:
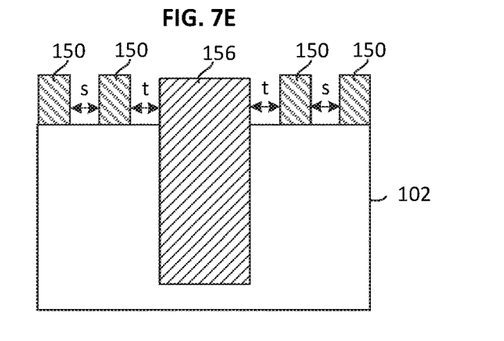

FIG. 7E illustrates an example structure after removing the spacer material 152, leaving exposed regions of the base 102 between regions of the hardmask 152 and the dummy material 156. In this example, the exposed regions of the base 102 have a consistent horizontal size corresponding to the desired fin spacing s between fins. The dummy material 156 is similarly spaced from each hardmask 150 region by horizontal distance t. As noted above, various grating structures may have the same or different spacing s as appropriate for the particular grating structure to be formed at a given location. In some embodiments, the exposed region of the base 102 between the hardmask 150 and the dummy material 156 is equal to horizontal distance t of spacer material 152 (shown in FIG. 7D), where $\frac{1}{2}s \leq t \leq 2s$.

Method 200 continues with etching 235 the base material(s) to define one or more grating structures. Etching 235 may be performed with any suitable wet or dry etching process for the material(s) to be etched and desired depth of etch, as will be appreciated. In one embodiment, the base is etched 235 using an anisotropic etch to a depth of 50 to 500 nm in the base. In one embodiment, the hardmask 150 protects regions of the base 102 during the etch process and results in a series of fins with vertical or nearly vertical sidewalls. When the dummy material is spaced from the hardmask by the fin spacing s, the etch rate of the base material(s) between the dummy material and the end member of the grating structure may be equal to the etch rate of the base material(s) between the end member and the adjacent member of the grating structure, for example. The improvement in etch rate consistency is due at least in part to the consistency in amount of material being etched in the respective regions. For example, etching 235 the base material(s) results in trenches of a consistent width (e.g., fin spacing s), such as from 5 nm to 50 nm, including 10 nm, 20 nm, 25 nm, 30 nm, and 40 nm.

Figure 7F:
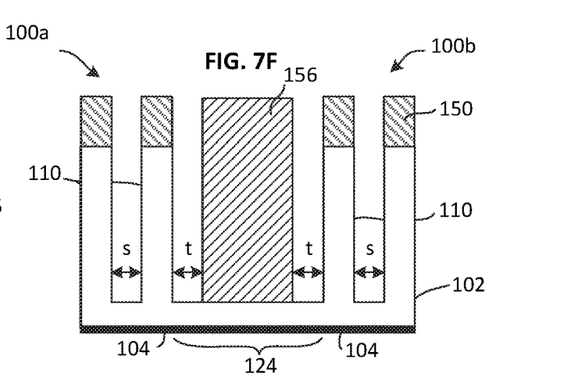

FIG. 7F illustrates an example structure after the base 102 is etched to define grating structures 100a and 100b. Each grating structure 100a, 100b includes fins 110 spaced apart by fin spacing s, which may be the same or different for the grating structures 100a, 100b. The hardmask 150 remains on the top of each fin 110 and the dummy material 156 is positioned in the gap 124 between end members 104 of the grating structures 110a, 110b.

Method 200 continues with recessing 240 the dummy material adjacent the grating structure(s). The dummy material may be recessed by a suitable wet or dry etch process, such as an etch process that is inert with respect to the material of the grating structure (e.g., fins 110). Recessing 240 the dummy material results in a process artifact unless the etch process can be tailored to exactly match the elevation of the base as it would appear when no dummy material is used. The process artifact may be a stub of dummy material (e.g., due to less etching than required to completely remove the dummy material) or a recess in the base (e.g., due to more etching than required to completely remove the dummy material).

Figure 7G:
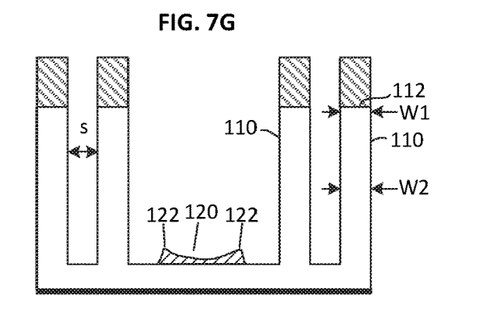

FIG. 7G illustrates an example structure after recessing the dummy material 156, resulting in a process artifact 120. Here, the process artifact 120 is a stub of dummy material 156 with a peak 122 corresponding to each boundary between materials of different etch rates. The fins 110 have a first fin width w1 as measured at or near the top end 112 of the fin. The first fin width w1 is less than three nm different than the second fin width w2 as measured a predefined distance (e.g., 50 nm) below the top end 112 of the fin 110. In this example, the hardmask 150 remains on the top surface of each fin 110 to protect the top end 112 of the fin 110 during various subsequent processes.

Method 200 optionally continues with deposition 245 of isolation material in contact with a lower portion of the members of the grating structure. For example, the isolation material may be an oxide (e.g., $SiO_2$), a nitride (e.g., $Si_3N_4$), a high-k dielectric (e.g., hafnium oxide), low-k dielectric (e.g., porous $SiO_2$), alumina, a spin-on dielectric, or some other electrically insulating material in accordance with some embodiments. The isolation material can have a vertical layer thickness so that the isolation material extends part way up the members of the grating structure. For example, the top 20-50 nm of the fins are exposed above the isolation material for further processing. In some embodiments, the isolation material may include a multilayer structure, such as a first layer comprising a first insulator material and a second layer comprising a second insulator material. Any number of isolation structures can be used, as will be appreciated in light of this disclosure.

Figure 7H:
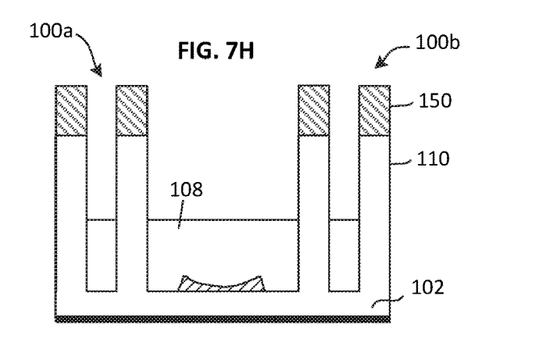

FIG. 7H illustrates an example structure with two grating structures 100a, 100b formed in material(s) of the base 102. A layer of isolation material 108 is on the base 102 and extends part way up each fin 110. The hardmask 150 optionally remains intact on the top end of each fin 110 at this stage of processing.

Method 200 optionally continues with additional processing 250 as required to complete an integrated circuit implementing the grating structure(s). For example, additional processing may include removal of the hardmask, formation of a gate structure, formation of source and drain regions, formation of source and drain contacts, and formation of interconnect between the grating structure and other components of the integrated circuit, and other processing, as will be appreciated. FIG. 4, discussed above, illustrates a cross-sectional view illustrating one example of part of an integrated circuit 10 with a grating structure 100 of fins 110 that has been processed to include a gate structure in contact with the upper portion of each fin 110.

Figure 8:
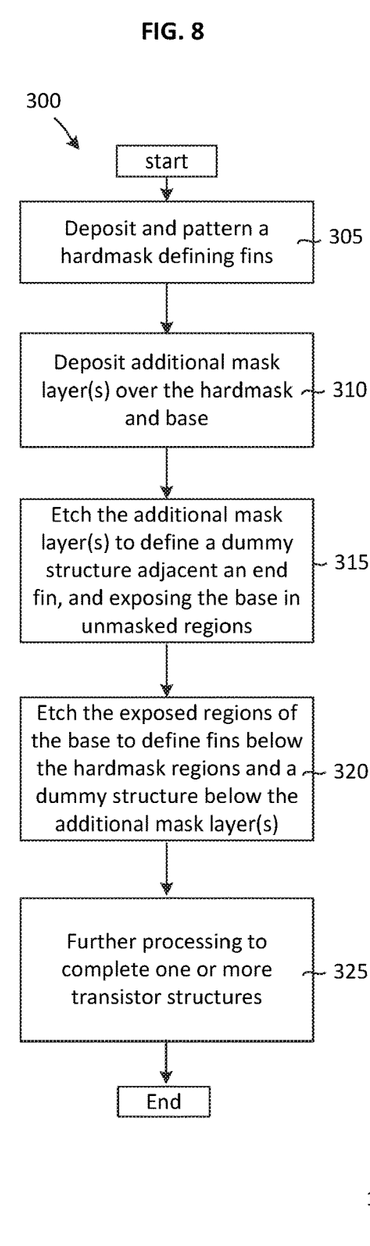
FIG. 8 is a flowchart illustrating a method of forming semiconductor fins, in accordance with an embodiment of the present disclosure.

Referring now to FIG. 8, a flowchart illustrates processes in a method 300 of forming a plurality of fins or other grating structure, in accordance with an embodiment of the present disclosure. To facilitate understanding of processes in method 300, FIGS. 9A-9D are presented alongside process blocks and show cross-sectional views of example structures. Method 300 is discussed in the context of forming fins as may be useful for fin-based transistor structures. Method 300 may be applied to other grating structures, as will be appreciated.

Figure 9A:
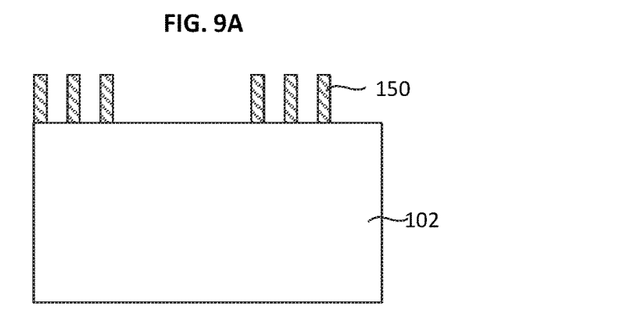
FIGS. 9A-9D illustrate cross-sectional view of example structures resulting from the method of FIG. 8.

Method 300 begins with depositing and patterning 305 a hardmask on a base of semiconductor material(s). As with method 200 discussed above, the hardmask is configured to define one or more groups of spaced-apart fins. The hardmask can be titanium nitride (TiN), a metal, or other suitable mask material, as will be appreciated. FIG. 9A illustrates a cross-sectional view of an example structure showing a hardmask patterned to result in two groups of fin-like structures.

Method 300 continues with depositing 310 an additional mask to define a dummy structure adjacent each group of fins. In embodiments with two or more groups of fins, the additional mask can be formed as a single structure between each pair of adjacent groups of fins. Alternately, the additional mask may define a separate dummy structure adjacent to each end member of the group of fins. In one embodiment, forming the additional mask includes depositing a blanket layer of liner material over the hardmask and exposed base. A blanket layer of dummy material is then deposited on the liner material followed by planarization as needed. For example, the liner material is an intermediate material with favorable adhesion to the base and to the dummy material. Examples of liner material include those discussed above for spacer material 152. The dummy material can be any suitable material, such as the example materials discussed above for process 225.

Figure 9B:
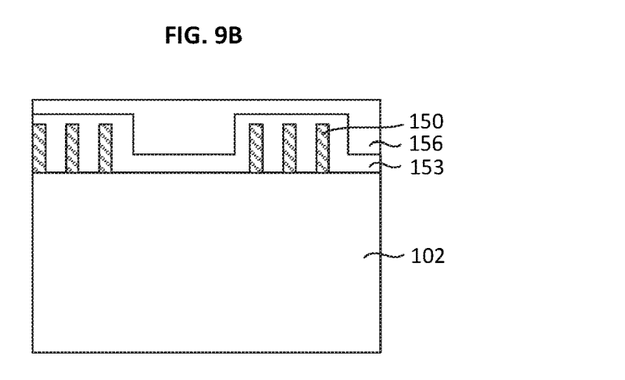

FIG. 9B illustrates an example structure showing a layer of liner material 153 deposited over the hardmask and base as well as a layer of dummy material 156 deposited on the liner material. The dummy material 156 has been planarized, such as with chemical mechanical polishing.

Method 300 continues with etching 315 the additional mask to define a dummy mask configured to result in a dummy structure of base material after subsequent etch processing of the base. As with the dummy material discussed above for process 225, the dummy mask is spaced from the hardmask of each group of fins by distance t, which may equal the respective fin spacing s or an acceptable deviation from the fin spacing. As discussed above, the dummy structure can be spaced by an amount from 50% to 200% of the fin spacing s, in some embodiments.

Figure 9C:
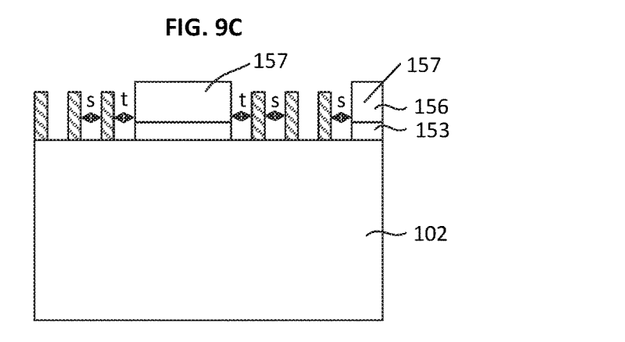

FIG. 9C illustrates an example structure with regions of patterned hard mask 150 and dummy masks 157 on the base 102. The dummy masks 157 are spaced from the hard mask 150 by distance t approximating the fin spacing s. Each dummy mask 157 includes a layer of liner material 153 in contact with the base 102 and a layer of dummy material 156 on the liner material.

Method 300 continues with etching 320 the base material(s) to define fins as permitted by the hardmask and dummy mask(s). Examples of suitable etch processes are discussed above for process 235.

Figure 9D:
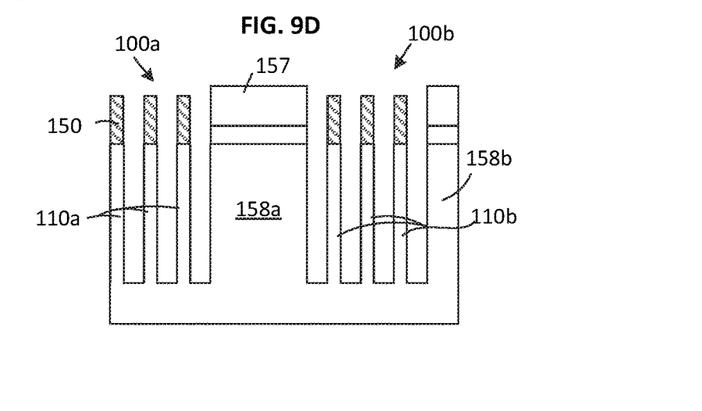

FIG. 9D illustrates an example structure with a first grating structure 100a having a plurality of fins 110a and a second grating structure 100b having a plurality of fins 110b. In this example, the hardmask 150 is present on the tops of each fin and the dummy mask 157 is on top of each dummy structure 158a, 158b. The masks may be subsequently removed as appropriate for additional processing. A first dummy structure 158a is positioned between the grating structures 100a, 100b and a second dummy structure 158b is adjacent the right-side member of grating structure 100b. In some embodiments, each grating structure is flanked by dummy structures spaced from end members of the grating structure.

Method 300 optionally continues with additional processing 325 to complete one or more transistor structures. In one embodiment, fins 110 of each grating structure 100 are processed to include a source electrode, a drain electrode, and a gate electrode. The gate electrode can be a top gate, dual gate, trigate, or gate all around (GAA) configuration, for example. The fins 110 may additionally be processed to define nanowires or other channel region structures, as will be appreciated. Additional processing 325 may further include formation of contacts and metal interconnect to other structures in an integrated circuit. In some embodiments, the dummy structure 158 is removed. In other embodiments, the dummy structure 158 remains, but is not used as a part of the transistor structure. Numerous configurations and embodiments will be apparent in light of the present disclosure.

Example System

Figure 10:
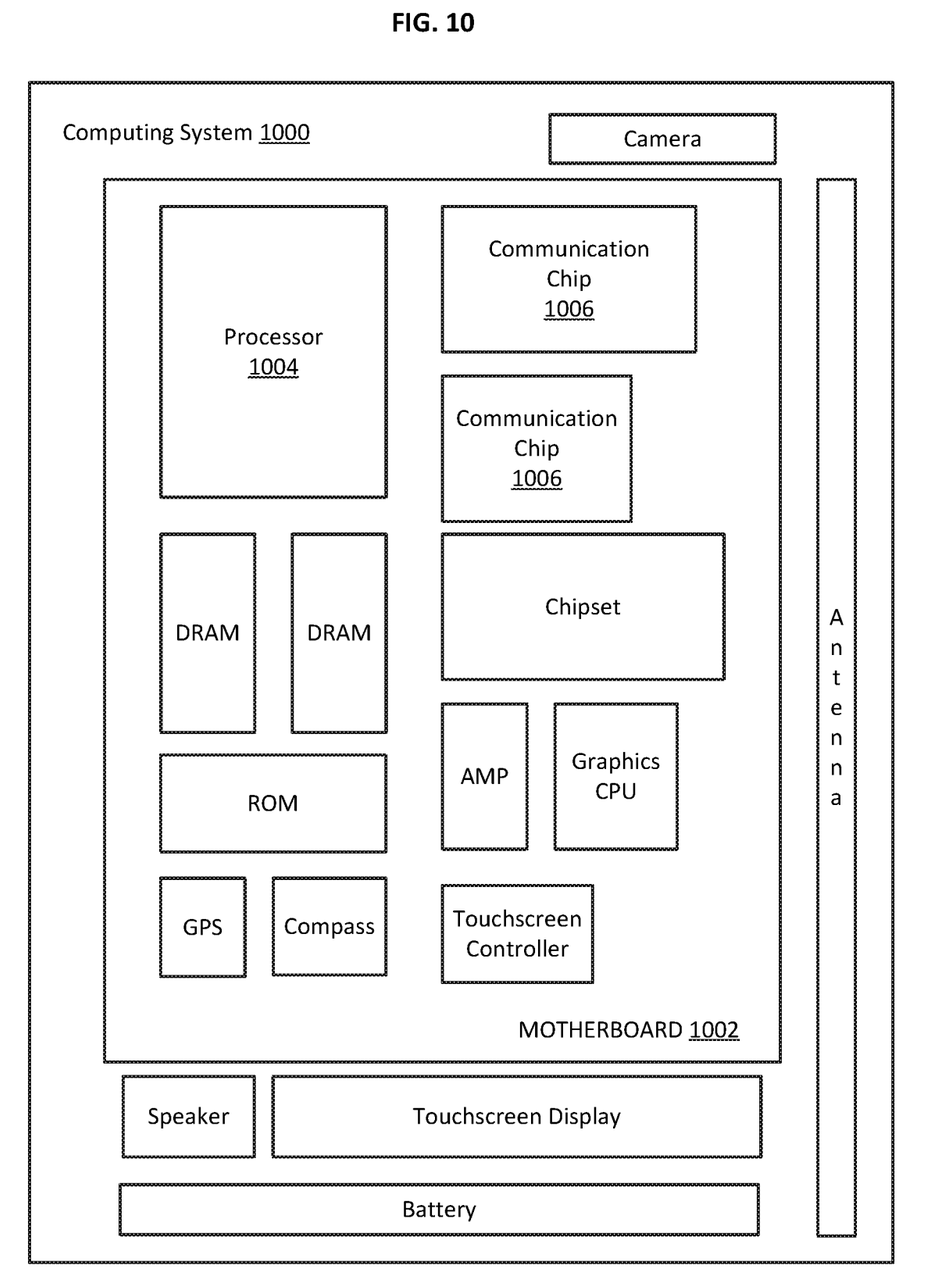
FIG. 10 is a diagram of a computing system implementing one or more integrated circuits, in accordance with an embodiment of the present disclosure.

FIG. 10 illustrates an example computing system 1000 including integrated circuit structures, transistor structures, and/or grating structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit comprising a grating structure comprising a first semiconductor material and having a plurality of grating members including an end member, members of the plurality of grating members extending upward from a base in a spaced-apart parallel relationship and defining a member width, a member height, and a member spacing between adjacent members of the plurality of grating members; and a process artifact adjacent the end member, wherein the process artifact is spaced from the end member by a horizontal distance from 50% to 200% of the member spacing, and wherein the process artifact is one of (i) a stub of a second material extending from the base, the second material being compositionally different from the first semiconductor material, or (ii) a recess extending into the base.

Example 2 includes the subject matter of Example 1, wherein the process artifact is the stub of the second material extending from the base, the second material being compositionally different from the first semiconductor material.

Example 3 includes the subject matter of Example 1, wherein the process artifact is the recess extending into the base.

Example 4 includes the subject matter of Example 2, wherein the first semiconductor material comprises (i) silicon, (ii) germanium, (iii) silicon and germanium, (iv) gallium and arsenic, (v) indium, gallium, and arsenic, (vi) silicon and carbon, (vii) gallium and nitrogen, (viii) aluminum and nitrogen, (ix) indium and phosphorous; and wherein the second material comprises (i) a metal, (ii) amorphous carbon, (iii) aluminum and oxygen, (iv) silicon and oxygen; (v) hafnium and oxygen, or (vi) silicon and nitrogen.

Example 5 is an integrated circuit with a grating structure, the grating structure comprising a plurality of fins comprising a first material, the plurality of fins extending upward from a base in a spaced-apart, generally parallel relationship, wherein fins of the plurality of fins have a fin width, a fin height, and a fin spacing between adjacent fins, and wherein the plurality of fins includes an end fin adjacent only one of the plurality of fins; and a process artifact horizontally spaced no more than twice the fin spacing from a bottom end portion of the end fin, the process artifact comprising (i) a stub of a second material extending from the base, the second material being compositionally different from the first material, or (ii) a recess extending into the base.

Example 6 includes the subject matter of Example 5, wherein the process artifact is spaced from the end fin by a distance from 90% to 110% of the fin spacing.

Example 7 includes the subject matter of Example 5, wherein the process artifact is the recess extending into the base and wherein a bottom of the recess is spaced from the end fin by a distance from 50% to 150% of the fin spacing.

Example 8 includes the subject matter of Example 8, wherein the process artifact is the stub of the second material and the stub of the second material defines at least one peak.

Example 9 includes the subject matter of any of Examples 5-8, wherein the process artifact exhibits at least two peaks extending upward from the base.

Example 10 includes the subject matter of any of Examples 5-9, wherein the fin height is greater than 50 nm.

Example 11 includes the subject matter of any of Examples 5-10, wherein the fin width of any one fin of the plurality of fins differs by no more than two nm along a 25 nm tall portion of the one fin.

Example 12 includes the subject matter of Example 11, wherein the fin width of any one fin of the plurality of fins differs by no more than one nm along a 25 nm tall portion of the one fin.

Example 13 includes the subject matter of any of Examples 5-10, wherein the fin width of any one fin of the plurality of fins differs by no more than two nm along a 50 nm tall portion of the one fin.

Example 14 includes the subject matter of Example 13, wherein the fin width of any one fin of the plurality of fins differs by no more than one nm along a 50 nm tall portion of the one fin.

Example 15 includes the subject matter of any of Examples 5-14, wherein the fin width is 8 nm or less at a location that is 10 nm or more from a top of the one fin and 10 nm or more from a bottom of the one fin.

Example 16 includes the subject matter of Example 15, wherein the fin width is 6 nm or less.

Example 17 includes the subject matter of Example 15, wherein the fin width is 5 nm or less.

Example 18 includes the subject matter of Example 15, wherein the fin width is 4 nm or less.

Example 19 includes the subject matter of Example 15, wherein the fin width is 3 nm or less.

Example 20 includes the subject matter of Examples 5-19, wherein the fin height is at least 8 times the fin width.

Example 21 includes the subject matter of any of Examples 5-20, wherein the first material is a semiconductor.

Example 22 includes the subject matter of Example 21, wherein the first material comprises a Group IV semiconductor material.

Example 23 includes the subject matter of Example 22, wherein the first material comprises a Group III-V semiconductor material.

Example 24 includes the subject matter of any of Examples 5-23, wherein the process artifact has an artifact width at least as great as the fin width.

Example 25 includes the subject matter of any of Examples 5-24 further comprising a layer of isolation material on the base in contact with a lower portion of the plurality of fins.

Example 26 includes the subject matter of any of Examples 5-25 further comprising a gate structure in contact with a portion of fins of the plurality of fins, the gate structure including a gate electrode and a gate dielectric between the first material and the gate electrode, wherein the portion is between a source region and a drain region.

Example 27 includes the subject matter of Example 26 further comprising a source contact on the source region and a drain contact on the drain region.

Example 28 includes the subject matter of any of Example 1-27, wherein the grating structure is a first grating structure and the integrated circuit further comprises a second grating structure spaced from the first grating structure by more than twice the fin spacing, the second grating structure including a second plurality of fins extending up from the base in a spaced-apart, generally parallel relationship, wherein fins of the second plurality of fins have a second fin width, a second fin height, and a second fin spacing between adjacent fins, and wherein the second plurality of fins includes a second end fin adjacent only one of the second plurality of fins; wherein the processing artifact is positioned between the first grating structure and the second grating structure and laterally spaced no more than twice the fin spacing from a lower end portion of an end fin of the second grating structure.

Example 29 includes the subject matter of Examples 1-28, wherein the process artifact exhibits at least two peaks extending up from the base.

Example 30 is a method of forming a grating structure of an integrated circuit, the method comprising: providing a base comprising a first material; forming a hardmask on the base, the hardmask defining locations of a plurality of spaced-apart grating members of a grating structure to be defined in the first material; depositing a spacer material on the base between and adjacent regions of the hardmask, the spacer material compositionally different from the hardmask and from the first material; defining a trench in the base, the trench spaced from the plurality of spaced-apart grating members of the grating structure by an amount from 50% to 200% of a spacing between adjacent members of the plurality of spaced-apart grating members; filling the trench with dummy material that is compositionally different from the spacer material; removing the spacer material; etching the base to define the plurality of spaced-apart grating members in the first material; and removing the dummy material.

Example 31 includes the subject matter of Example 30, wherein removing the dummy material includes (i) forming a stub of dummy material on the base adjacent an end member of the plurality of spaced-apart grating members or (ii) forming a recess in the base adjacent to and extending vertically below the base of an end member of the plurality of spaced-apart grating members.

Example 32 includes the subject matter of Examples 30 or 31 further comprising recessing the dummy material to be coplanar with the first material.

Example 33 includes the subject matter of any of Examples 30-32, wherein the first material comprises a Group IV or a Group III-V semiconductor.

Example 34 includes the subject matter of any of Examples 30-33, wherein the dummy material and the spacer material comprise (i) a metal, (ii) amorphous carbon, (iii) aluminum and oxygen, (iv) silicon and oxygen; (v) hafnium and oxygen, or (vi) silicon and nitrogen.

Example 35 includes the subject matter of Example 33 further comprising: forming a gate structure in contact with a body portion of members of the plurality of spaced-apart grating members, wherein the body portion is between a source region and a drain region; forming a source contact on the members adjacent the gate structure; and forming a drain contact on the members adjacent the gate structure, wherein the gate structure is between the source contact and the drain contact.

Example 36 is a method of forming semiconductor fins, the method comprising: providing a base comprising a first material; forming a hardmask on the base, the hardmask defining locations of a plurality of fins to be defined in the base and spaced apart by a fin spacing; forming an additional mask on the base adjacent an end fin of the plurality of fins to be defined, the additional mask spaced from the hardmask by the fin spacing ±20%; etching the base to define a plurality of fins spaced apart by the fin spacing, and defining a dummy structure spaced from the end fin by the fin spacing ±20%; removing the hardmask; forming a gate structure in contact with fins of the plurality of fins; forming a source contact on the fins adjacent the gate structure; and forming a drain contact on the fins adjacent the gate structure, wherein the gate structure is between the source contact and the drain contact.

Example 37 includes the subject matter of Example 36 further comprising selecting the base comprising at least one semiconductor material selected from a Group IV semiconductor material and a Group III-V semiconductor material.

The foregoing description and example embodiments has been presented for the purposes of illustration. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
    a grating structure comprising a first semiconductor material and having a plurality of grating members including an end member, members of the plurality of grating members extending upward from a base in a spaced-apart parallel relationship and defining a member width, a member height, and a member spacing between adjacent members of the plurality of grating members; and a process artifact adjacent the end member, wherein the process artifact is spaced from the end member by a horizontal distance from 50% to 200% of the member spacing, and wherein the process artifact is a stub of a second material extending from the base, the second material being compositionally different from the first semiconductor material.

2. The integrated circuit of claim 1, wherein the second material comprising (i) a metal, (ii) amorphous carbon, (iii) aluminum and oxygen, (iv) silicon and oxygen; (v) hafnium and oxygen, or (vi) silicon and nitrogen.

3. An integrated circuit with a grating structure, the grating structure comprising:
    a plurality of tins comprising a first material, the plurality of tins extending upward from a base in a spaced-apart, generally parallel relationship, wherein fins of the plurality of fins have a fin width, a fin height, and a fin spacing between adjacent fins, and wherein the plurality of fins includes an end fin adjacent only one of the plurality of fins; a process artifact horizontally spaced no more than twice the in spacing from a bottom end portion of the end fin, the process artifact comprising a stub of a second material extending from the base, the second material being compositionally different from the first material.

4. The integrated circuit of claim 3, wherein the process artifact is spaced from the end fin by a distance from 90% to 110% of the fin spacing.

5. The integrated circuit of claim 3, wherein the stub of the second material defines at least one peak.

6. The integrated circuit of claim 3, wherein the fin height is greater than 50 nm.

7. The integrated circuit of claim 6, wherein the fin width of any one fin of the plurality of fins differs by no more than two nm along a 25 nm tall portion of the one fin.

8. The integrated circuit of claim 6, wherein the fin width of any one fin of the plurality of fins differs by no more than one nm along a 25 nm tall portion of the one fin.

9. The integrated circuit of claim 8, wherein the fin width is 8 nm or less at a location that is 10 nm or more from a top of the one fin and 10 nm or more from a bottom of the one fin.

10. The integrated circuit of claim 3, wherein the first material comprises a Group IV semiconductor material or a Group III-V semiconductor material.

11. The integrated circuit of claim 3, wherein the process artifact has an artifact width at least as great as the fin width.

12. The integrated circuit of claim 3 further comprising a layer of isolation material on the base in contact with a lower portion of the plurality of fins.

13. The integrated circuit of claim 3 further comprising a gate structure in contact with a portion of fins of the plurality of fins, the gate structure including a gate electrode and a gate dielectric between the first material and the gate electrode, wherein the portion is between a source region and a drain region.

14. The integrated circuit of claim 3 further comprising a source contact on the source region and a drain contact on the drain region.

15. The integrated circuit of claim 3, wherein the grating structure is a first grating structure and the integrated circuit further comprises a second grating structure spaced from the first grating structure by more than twice the fin spacing, the second grating structure including a second plurality of fins, wherein fins of the second plurality of fins have a second fin width, a second fin height, and a second fin spacing between adjacent fins, and wherein the second plurality of fins includes a second end fin adjacent only one of the second plurality of fins;
    wherein the processing artifact is positioned between the first grating structure and the second grating structure and horizontally spaced no more than twice the second fin spacing from a lower end portion of an end fin of the second grating structure.

\* \* \* \* \*